(12) United States Patent
Milovanov et al.

(10) Patent No.: US 11,328,100 B2
(45) Date of Patent: May 10, 2022

(54) REGULAR GRID RECOGNITION IN A CAD MODEL

(71) Applicant: BRICSYS NV, Ghent (BE)

(72) Inventors: Roman Milovanov, Zarinsk (RU); Alexander Yarovenko, Novosibirsk (RU)

(73) Assignee: BRICSYS NV, Ghent (BE)

( * ) Notice: Subject to any disclaimer, the term of this patent is extended or adjusted under 35 U.S.C. 154(b) by 0 days.

(21) Appl. No.: 17/019,222

(22) Filed: Sep. 12, 2020

(65) Prior Publication Data

US 2021/0081581 A1 Mar. 18, 2021

(30) Foreign Application Priority Data

Sep. 13, 2019 (EP) ..................................... 19197298

(51) Int. Cl.
*G06G 7/48* (2006.01)
*G06F 30/10* (2020.01)

(52) U.S. Cl.
CPC .................................... *G06F 30/10* (2020.01)

(58) Field of Classification Search
CPC ............ G06F 30/10; G06T 9/00; G06T 9/004
See application file for complete search history.

(56) References Cited

U.S. PATENT DOCUMENTS

| | | | |
|---|---|---|---|
| 5,335,290 A * | 8/1994 | Cullen | G06K 9/00456 |
| | | | 358/1.9 |
| 6,396,490 B1 * | 5/2002 | Gorman | G06T 9/001 |
| | | | 345/419 |
| 7,068,271 B2 | 6/2006 | Dennis et al. | |
| 7,672,976 B2 * | 3/2010 | Tobin | G06F 16/5838 |
| | | | 707/999.107 |
| 7,860,691 B2 | 12/2010 | Beltran et al. | |
| 7,999,827 B2 | 8/2011 | Ford et al. | |
| 2012/0106858 A1 | 5/2012 | Cai et al. | |

(Continued)

OTHER PUBLICATIONS

S. Joshi et al., "Graph-based heuristics for recognition of machined features from a 3D solid model" Computer-aided design, vol. 20, Issue 2, pp. 58-66 (Feb. 1998).

(Continued)

*Primary Examiner* — Rehana Perveen
*Assistant Examiner* — Nithya J. Moll
(74) *Attorney, Agent, or Firm* — Maschoff Brennan

(57) ABSTRACT

A multitude of equal elements is identified in a CAD model. An element is an entity, a feature, a grid, an entity reference, a feature reference or a grid reference. Equal elements comprise an identical element geometry. A regular grid of multiple repetition positions is determined based on insertion positions of equal elements of the multitude. A group of multiple equal elements of the multitude, which comprise an insertion position associated with a repetition position of the regular grid, is replaced in the CAD model with grid data. The grid data comprises a grid insertion position, element data, and element repetition data. The element data may be a pointer to an element definition comprising said identical element geometry. The element repetition data may comprise linearly independent vectors and a number of repetitions according to each vector. Compression and ergonomic subsequent user editing of the CAD model are achieved.

15 Claims, 1 Drawing Sheet

(56) References Cited

U.S. PATENT DOCUMENTS

2014/0354636 A1* 12/2014 Rorato .................. G06T 9/00
                                                                                 345/420
2019/0087979 A1* 3/2019 Mammou .............. G06T 9/001

OTHER PUBLICATIONS

Mark Pauly et al., "Discovering structural regularity in 3D geometry", ACM Transactions on Graphics, vol. 27, Issue 3, pp. 1-11, (Aug. 1, 2008).
John Wiley & Sons, "The ABCs of Blocks", Chapter 17 of AutoCAD 2013 for Dummies, pp. 369-386 (2012).
Extended European Search Report dated Mar. 31, 2020 as received in Application No. 19197298.3.

* cited by examiner

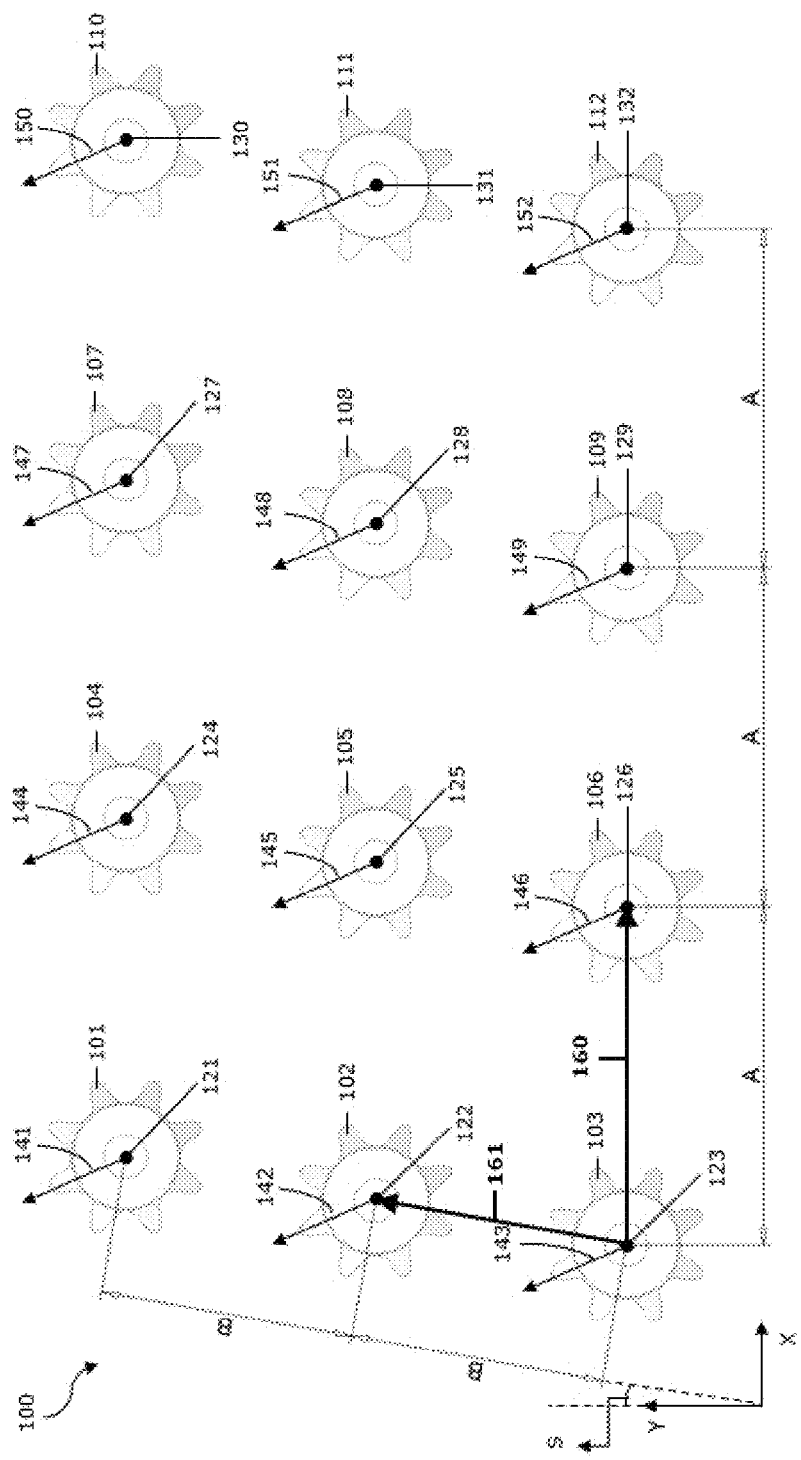

REGULAR GRID RECOGNITION IN A CAD MODEL

FIELD OF THE INVENTION

The present computer-implemented invention relates to an automatic compression of a computer-aided design (CAD) model via detection of a regular grid of equal elements in the CAD model and corresponding data replacement.

BACKGROUND

Chapter 17 of "AutoCAD 2013 for Dummies", John Wiley & Sons (2012), ISBN 978-1-118-39217-1, pages 369-386, is entitled "The ABCs of Blocks". In this chapter, the terms "block", "block definition" and "block reference" are explained and utilized throughout.

A user may create a block definition via the BLOCK command in BricsCAD V18 and AutoCAD 2018. The block definition comprises a block geometry. To insert one or more instances of the block geometry in a CAD model, the user may insert one or more block references in the CAD model. A block reference comprises a pointer to the block definition and a position within the CAD model. The block reference may further comprise transformation data, such as rotation data and/or scaling data.

Blocks, a shorthand term for block definitions and block references, provide a compact representation of multiple instances of a block geometry in a CAD model. Required computer resources (disk, memory and CPU time) for storage, loading and handling, as well as user effort for editing, can be reduced to a fraction.

U.S. Pat. No. 7,860,691 B2 and U.S. Pat. No. 7,999,827 B2 disclose user association of an array action with a parameter of an existing dynamic block. An array action causes associated objects to copy and array in a pattern when the associated parameter is edited. For example, a user may associate an array action with a linear parameter. The user may specify that the array action has an offset of 2. When the linear parameter in a block instantiation is then changed to 10, the number of objects for the block instantiation automatically becomes 5.

U.S. Pat. No. 7,068,271 B2 discloses user association of a second graphical element (e.g. bolt) with an existing instance of a graphical element pattern defining a distribution of multiple occurrences of a source graphical element (e.g. rectangular array of holes). In response to the user association, multiple occurrences of the second graphical element are positioned in accordance with the graphical element pattern. The second graphical element may be a component (e.g. bolt) or a feature of a component (e.g. hole). The pattern may be rectangular, circular or user-defined.

In U.S. Pat. No. 7,068,271 B2, U.S. Pat. No. 7,860,691 B2 and U.S. Pat. No. 7,999,827 B2 the array, pattern or grid data representing multiple instances of an element is already present in the CAD model, or is added via user input. These documents do not provide for the automatic detection of an array, pattern or grid. These documents do not address the automatic creation of array, pattern or grid data. These documents are not concerned with CAD model compression, because the array, pattern or grid data representing multiple instances of an element is already present.

S. Joshi and T. C. Chang, "Graph-based heuristics for recognition of machined features from a 3D solid model", Computer-aided design 20(2), pages 58-66 (1988), doi: 10.1016/0010-4485(88)90050-4, discloses an attributed adjacency graph (AAG) for the automated recognition of machined features from a 3D boundary representation (B-rep) of a solid, based on heuristic rules. Joshi (1988), however, does not teach automatic recognition of equal solids, or automatic detection of an array, pattern or grid.

M. Pauly, N. J. Mitra, J. Wallner, H. Pottmann and L. J. Guibas, "Discovering Structural Regularity in 3D Geometry", ACM Transactions on Graphics 27(3), article 43 (2008), doi:10.1145/1360612.1360642, discloses a method for simultaneously detecting a repetition pattern and the repeating geometric element. The method utilizes repetition group generators, which are translation vectors in case of translations.

The present invention aims to resolve at least some of the problems and disadvantages mentioned above.

SUMMARY OF THE INVENTION

In a first aspect, the present invention provides a computer-implemented method (CIM) for compressing a CAD model, according to claim 1.

In a second aspect, the present invention provides a computer system for compressing a CAD model, whereby the computer system is configured for performing the CIM according to the first aspect of the present invention.

In a third aspect, the present invention provides a computer program product (CPP) for compressing a CAD model. The CPP comprises instructions which, when the CPP is executed by a computer, cause the computer to carry out the CIM according to the first aspect of the present invention.

The element data may be or may comprise the identical element geometry. The element data may be or may comprise a pointer to an element definition (e.g. a block definition) comprising the identical element geometry. The element repetition data may comprise linearly independent vectors and a number of repetitions according to each vector. Further embodiments may be disclosed in the detailed description.

The present invention realizes compression of the CAD model based on the regular grid. Compared to a prior art block definition and block references, wherein the CAD model comprises for each repetition (of e.g. 100 repetitions) a block reference comprising a pointer to a block definition and an insertion position,

- no element reference (e.g. in case the element data is or comprises the element geometry) or only a single element reference (e.g. in case the element data is or comprises a pointer to an element definition) is needed, instead of a number of element references equal to the number of repetitions;
- only a single grid insertion position in combination with the element repetition data is needed, instead of a number of insertion positions equal to the number of repetitions.

The present invention realizes ergonomic subsequent user editing of the CAD model based on the element repetition data, thereby lowering the physiological burden on the user, i.e. less operations are required. Compared to a prior art block definition and block references, which allows simultaneous editing of multiple instances via editing of the block geometry of the block definition, the present invention also allows user editing of repetition positions and/or repetition orientations and/or number of repetitions, while automatically maintaining grid regularity, via user editing of the element repetition data, such as user editing of linearly independent vectors and/or a number of repetitions according to a vector.

DESCRIPTION OF FIGURES

FIG. 1 shows a schematic representation of an embodiment of a CAD model comprising multiple equal entities comprising insertion positions arranged according to a regular grid and an identical insertion orientation.

DETAILED DESCRIPTION OF THE INVENTION

The present invention concerns a CIM, a computer system, and a CPP for compressing a CAD model. The invention has been summarized in the corresponding section above. In what follows, the invention is described in detail, preferred embodiments are discussed, and the invention is illustrated by means of non-limitative examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

1. Term Definitions

"A", "an", and "the" as used herein refer to both singular and plural referents unless the context clearly dictates otherwise. By way of example, "a compartment" refers to one or more than one compartment.

"Comprise", "comprising", "comprises" and "comprised of" as used herein are synonymous with "include", "including", "includes" or "contain", "containing", "contains" and are inclusive or open-ended terms that specify the presence of what follows (e.g. component) and do not exclude or preclude the presence of additional, non-recited components, features, elements, members, and steps.

"Based on" as used herein is synonymous with "based at least in part on" and is an inclusive or open-ended term that specifies the presence of what follows (e.g. component) and does not exclude or preclude the presence of additional, non-recited components, features, elements, members, and steps.

A "computer-aided design model" (CAD model), as used herein, comprises computer-processable data, preferably digital data, about one or more elements. The data represents, or allows to derive, one or more properties of an element, such as geometric properties, material properties and/or semantic properties. In case the CAD model comprises computer-processable data about multiple elements, the data also represents, or allows to derive, relative geometric properties between elements. The present invention may pertain to various types of CAD models, such as, for example, a building information model (BIM), a computer-aided architectural design (CAAD) model, or a mechanical engineering CAD model. An exemplary file format for storing a CAD model is DWG. One of ordinary skill in the art will appreciate that a CAD model comprises a computer-processable image in vector format, e.g. in DWG file format, defined in terms of low-level features, such as, for example, vertices, edges, and faces.

A CAD model may be viewed and edited via a corresponding CPP, so-called CAD software. CAD software preferably provides a graphical user interface (GUI) for viewing and editing the CAD model. A non-limiting list of examples of CAD software comprises 123D, ACIS, Advance Concrete, Advance Design, Advance Steel, AllyCAD, ArchiCAD, AutoCAD, BricsCAD, BRL-CAD, C3D, Caddie, Cadwork, CATIA, Chief Architect, Cobalt, Creo, DataCAD, DesignSpark Mechanical, Digital Project, Drawing Express, FINE MEP, form•Z, FreeCAD, HiCAD, IDEA Architectural, Inventor, IRONCAD, ItelliCAD, KeyCreator, LibreCAD, MEDUSA, MicroStation, Modelur, NanoCAD, NX, OpenCASCADE, OpenSCAD, Parasolid, PTC Creo, PowerCADD, progeCAD, PunchCAD, QCad, Revit Architecture, Revit MEP, Revit Structure, Rhinoceros 3D, RoutCad, SALOME, ShapeManager, SketchUp, Solid Edge, SolidWorks, SolveSpace, SpaceClaim, SpaceClaim Engineer, Tekla Structures, TopSolid, TransMagic, TurboCAD, VariCAD, VectorWorks, and VisualARQ.

A "hierarchical spatial index" is a data structure comprising intermediary nodes and leaf nodes, which allows for accessing an element efficiently. A leaf node comprises a pointer to an element and spatial containment information about the element. An intermediary node comprises pointers to one or more nodes (leaf and/or intermediary nodes) and spatial containment information for all elements to which it points. A preferred hierarchical spatial index for CAD models is an "R-tree", wherein the spatial containment information is a bounding box (e.g. a rectangle or a cuboid).

An "element", as used herein, is an entity, a feature, a grid, an entity reference, a feature reference or a grid reference. An element comprises an element geometry.

The skilled person appreciates that an element "comprising" an element geometry refers to the element "comprising data from which the element geometry may be derived". An entity, as used herein, represents a component, body or object, such as a beam, a column, a wall, a bolt, and the like. A feature, as used herein, represents a modification or patch of an entity, such as a hole in a beam.

An "element definition", as used herein, comprises an element geometry. A prior art example of an element definition is a block definition comprising a block (entity) geometry. An "element reference", as used herein, comprises a pointer to an element definition. A prior art example of an element reference is a block reference comprising a pointer to a block definition. Each one of an element definition and an element reference "comprises" an element geometry, either directly or indirectly, as it comprises data from which the element geometry may be derived. An element reference comprises an element geometry indirectly, as it comprises a pointer to a block definition comprising an element geometry. Based on the pointer, the element geometry may be obtained.

A "grid", as used herein, is synonymous with "array" or "pattern", and represents a particular arrangement. A grid of elements represents a particular arrangement of elements, such as an arrangement of entities, an arrangement of features or an arrangement of grids. An example of the latter is a two-dimensional parallelogrammatic (skew) or rectangular (straight) grid, which may correspond to a one-dimensional arrangement of one-dimensional linear grids. "Grid data", as used herein, refers to data representing, or allowing to derive, the corresponding particular arrangement.

2. Aspects of the Present Invention

In a first aspect, the present invention provides a CIM for compressing a CAD model, comprising several steps. In a second aspect, the present invention provides a computer system for compressing a CAD model, whereby the computer system is configured for performing the CIM according to the first aspect. In a third aspect, the present invention provides a CPP for compressing a CAD model, wherein the CPP comprises instructions which, when the CPP is executed by a computer, such as a computer system according to the second aspect, cause the computer to carry out the CIM according to the first aspect. The present invention may further also provide a tangible non-transitory computer-readable data carrier comprising the CPP according to the third aspect. The first, second and third aspects of the present invention are hence interrelated. Therefore, all features and embodiments disclosed in this document, above or below, may relate to each of these first, second and third aspects, even if they have been disclosed in conjunction with a particular aspect.

A multitude of equal elements is automatically identified in a CAD model. Equal elements comprise an identical element geometry. For each equal element, an insertion position is automatically obtained. Preferably, an element comprises an insertion position. Preferably, for each equal element, an insertion position is automatically obtained from the element. A regular grid of multiple repetition positions is automatically determined based on insertion positions of equal elements of the multitude. A group of multiple equal elements of the multitude is automatically replaced in the CAD model with grid data. The equal elements of the group comprise an insertion position associated with a repetition position of the regular grid. The grid data comprises a grid insertion position, element data, and element repetition data.

The element data may be or may comprise the identical element geometry. The element data may be or may comprise a pointer to an element definition (e.g. a block definition) comprising the identical element geometry. The element repetition data may comprise linearly independent vectors and a number of repetitions according to each vector. Other embodiments may be disclosed below.

The present invention realizes compression of the CAD model based on the regular grid. Compared to a prior art block definition and block references, wherein the CAD model comprises for each repetition (of e.g. 100 repetitions) a block reference comprising a pointer to the block definition and an insertion position,
  no element reference (e.g. in case the element data is or comprises the element geometry) or only a single element reference (e.g. in case the element data is or comprises a pointer to an element definition) is needed, instead of a number of element references equal to the number of repetitions;
  only a single grid insertion position in combination with the element repetition data is needed, instead of a number of insertion positions equal to the number of repetitions.

The present invention realizes ergonomic subsequent user editing of the CAD model based on the element repetition data, thereby lowering the physiological burden on the user, i.e. less operations are required. Compared to a prior art block definition and block references, which allows simultaneous editing of multiple instances via editing of the block geometry of the block definition, the present invention also allows user editing of repetition positions and/or repetition orientations and/or number of repetitions, while automatically maintaining grid regularity, via user editing of the element repetition data, such as user editing of linearly independent vectors and/or a number of repetitions according to a vector.

Preferably, each repetition position of the regular grid coincides with an insertion position of an equal element of the multitude. Preferably, the insertion position of an equal element of the group coincides with a repetition position of the regular grid. Alternatively, a repetition position of the regular grid is associated with an insertion position of an equal element of the multitude, but comprises an offset with respect to the associated insertion position, in which case the grid data also comprises offset data representing the offset.

Preferably, an element comprises an insertion orientation. A requirement for equal elements may be that they comprise an identical insertion orientation. Alternatively, elements may be equal elements, regardless of whether they comprise an identical insertion orientation or not. Preferably, the equal elements of the multitude comprise an identical insertion orientation. In this case, the equal elements of the group also comprise an identical insertion orientation.

Preferably, the number of equal elements in the group is equal to the number of repetition positions of the regular grid, or the number of equal elements in the group is equal to one less than the number of repetition positions of the regular grid.

In a first example, the repetition positions consist of one origin position and one or more copy positions not coinciding with the origin position. In this example, the number of equal elements in the group is equal to one less than the number of repetition positions of the regular grid. In this example, an equal element in the group comprises an insertion position associated with a copy position. In this example, the element data is preferably a pointer to the equal element comprising an insertion position associated with the origin position. In this example, the group of equal elements does not comprise the equal element comprising an insertion position associated with the origin position. In this example, the equal element comprising an insertion position associated with the origin position is not replaced in the CAD model.

In a second example, the number of equal elements in the group is equal to the number of repetition positions of the regular grid. In this example, the element data is or comprises the identical element geometry. The element data may be or may comprise, for example, an element definition comprising the identical element geometry.

In a third and preferred example, the number of equal elements in the group is equal to the number of repetition positions of the regular grid. In this example, the element data is or comprises a pointer to an element definition comprising the identical element geometry. The CAD model may comprise the element definition. The element definition may alternatively be comprised in a separate CAD model or a separate file.

In a preferred embodiment, an element definition comprising said identical element geometry is automatically created, wherein said element data is a pointer to the element definition.

In a preferred embodiment, said multitude of equal elements comprising an identical element geometry is a multitude of equal element references (preferably either entity references or feature references) comprising an identical element geometry.

In a most preferred embodiment, the CIM comprises the steps of:
  automatically identifying in the CAD model a plurality of equal elements comprising an identical element geometry, wherein an element is an entity or a feature;
  automatically creating an element definition comprising said identical element geometry;

automatically obtaining for each equal element of the plurality an insertion position and an insertion orientation, preferably from the equal element;
automatically replacing each equal element of the plurality with an element reference comprising:
  a pointer to the element definition,
  the insertion position of the equal element, and
  the insertion orientation of the equal element;
automatically obtaining a multitude of element references comprising a pointer to said same element definition and an identical insertion orientation;
automatically determining a regular grid of multiple repetition positions based on insertion positions of element references of the multitude;
automatically replacing in the CAD model a group of multiple element references of said multitude, which comprise an insertion position associated with a repetition position of the regular grid, with grid data comprising:
  a grid insertion position,
  said identical insertion orientation,
  said pointer to the element definition, and
  element repetition information.

3. Regular Grid

Preferably, the regular grid is:
a one-dimensional linear, circular, ellipsoid, helical or path grid;
a two-dimensional parallelogrammatic, rectangular or polar grid; or
a three-dimensional parallelepipedic, cuboidal, cylindrical or spherical grid.

A path grid is associated with a curve, wherein the grid comprises equidistant, as measured along the path length of the curve, repetition positions on the curve.

Element repetition data associated with a polar grid may, for example, comprise:
a radial vector defining a radial offset for the polar grid and a first repetition position with respect to the grid insertion position,
a radial number of repetitions,
an angular vector, which is linearly independent from the radial vector, defining together with the radial vector a plane for the polar grid, preferably wherein the angular vector additionally defines a second repetition position with respect to either one of the first repetition position or with respect to the grid insertion position and thereby implicitly an angular offset for the polar grid, and
optionally, an angular number of repetitions according to the angular offset (and therefore, at least implicitly, according to the angular vector).

Alternatively, an angle offset for repetition positions may be explicitly specified in the element repetition data. Alternatively, a number of radial repetitions over 360° may be explicitly specified in the element repetition data.

Most preferably, the regular grid is a one-dimensional linear grid, a two-dimensional parallelogrammatic or rectangular grid, or a three-dimensional parallelepipedic or cuboidal grid.

Most preferably, the element repetition data comprises one, two or three linearly independent vectors, and for each vector a number of repetitions according to the vector.

In an example, a three-dimensional parallelepipedic (skew) or cuboidal (straight) grid is considered. Element repetition data associated with the grid preferably comprises three linearly independent vectors $\vec{w}_a$, $\vec{w}_b$ and $\vec{w}_c$, and for each vector a number of repetitions according to the vector, $N_a$, $N_b$ and $N_c$, respectively. With $\vec{p}_0$ defining the grid insertion position with respect to an origin of a global coordinate system (GCS) of the CAD model, the $N_a N_b N_c$ repetition positions of the grid correspond with $\vec{p}_{a,b,c} = \vec{p}_0 + a\vec{w}_a + b\vec{w}_b + c\vec{w}_c$, in which a, b and c are integers satisfying $0 \le a < N_a$, $0 \le b < N_b$ and $0 \le c < N_c$.

Preferably, the regular grid of multiple repetition positions is a regular grid of at least three repetition positions, preferably at least four repetition positions, more preferably at least five repetition positions, even more preferably at least six repetition positions, yet even more preferably at least seven repetition positions, with even greater preference at least eight repetition positions, with yet even greater preference at least nine repetition positions, and with greatest preference at least ten repetition positions.

4. Regular Grid Determination

In a preferred embodiment, the regular grid of multiple repetition positions is automatically determined based on the following steps. Distance values associated with pairs of equal elements of the multitude are automatically determined. Herein, a distance value of a pair corresponds with a distance or a power of a distance between the insertion positions of the equal elements of the pair. A preferred example of a power of a distance is a distance squared (power two). One or more determined distance values are automatically selected based on prevalence over the determined distance values. The regular grid of multiple repetition positions is then automatically determined based on the one or more selected distance values.

In a preferred embodiment, a distance matrix is constructed. The distance matrix comprises rows and columns. Each equal element is associated with one row of the distance matrix and with one column of the distance matrix. The distance matrix comprises a distance value in a row and a column, wherein the distance value is associated with the equal elements associated with said row and said column.

In a preferred embodiment, a distance graph is constructed. The distance graph comprises graph nodes and graph edges. A graph node of the distance graph represents an equal element of the multitude. A graph edge of the distance graph interconnects two graph nodes of the distance graph and comprises a weight equal to the distance value associated with the equal elements represented by the two graph nodes. The distance graph is most preferably represented as a matrix or array, such as, for example, said distance matrix.

Each graph edge of the distance graph, or equivalently each distance value of the distance matrix, implicitly defines a candidate vector for defining the regular grid. The candidate vector can be calculated based on the insertion positions of the equal elements represented by the two graph nodes associated with the graph edge, or equivalently of the equal elements associated with the row and the column of the matrix containing said distance value. By selecting the most prevalent distance values, candidate vectors are implicitly chosen to define the regular grid. The number of selected distance values can be smaller than, equal to or larger than the number of spanning vectors eventually defining the regular grid.

In a preferred embodiment, for each selected distance value, a candidate vector between insertion points of two equal elements is automatically determined. For a selected distance value, multiple, preferably linearly independent, candidate vectors between insertion points of corresponding pairs of equal elements may be automatically determined. A grid insertion position; one, two or three linearly independent spanning vectors; and for each spanning vector a number of repetitions according to the spanning vector are automatically determined based on insertion positions of equal elements of the multitude and the candidate vectors associated with the one or more selected distance values.

In a preferred embodiment, for each selected distance value, a set of linearly independent candidate vectors is constructed as follows. An empty set of candidate vectors is obtained. For each pair of two equal elements corresponding with the selected distance value, a candidate vector is calculated based on the insertion points of the equal elements of the pair. In case the calculated candidate vector and the candidate vectors of the set are linearly independent, the candidate vector is added to the set of candidate vectors. This is advantageous for recognition of a regular grid with equal spacing in different directions (e.g. a square grid).

Alternatively or additionally to distance values, candidate vectors associated with pairs of equal elements of the multitude are automatically determined. A candidate vector may be calculated based on the insertion positions of the equal elements of the pair. One or more determined candidate vectors are automatically selected based on prevalence over the determined candidate vectors. Preferably, a candidate vector and the corresponding candidate vector with equal length in the opposite direction are considered the same for the purpose of prevalence. Alternatively, a candidate vector is obtained so that it always comprises a non-negative inner product with a predefined axis, such as, for example, an X-axis of the GCS or the vector (1, 1, 1). A hierarchy of predefined axes may be provided for resolution of border cases, wherein in case an inner product is equal to zero, the next axis is utilized for discriminating between a candidate vector and the corresponding candidate vector with equal length in the opposite direction. An example of such a hierarchy may be, an X-axis, a Y-axis and a Z-axis of a GCS, in that order. For two insertion points, for example, (1, 4, 5) and (1, 4, 7), the candidate vector may be (0, 0, 2) or (0, 0, −2). Based on the exemplary hierarchy, and based on orthogonality of both vectors with the X-axis and the Y-axis of the GCS, (0, 0, 2) may be chosen as candidate vector, based on a positive inner product with the Z-axis of the GCS. The regular grid of multiple repetition positions is then automatically determined based on the one or more selected candidate vectors. A vector graph may be constructed, in analogy to the distance graph, whereby alternatively or additionally to an edge weight equal to a distance value, an edge attribute representing the candidate vector, is utilized.

An illustrative example is provided in example 1 below.

5. Equal Element Identification

Equal elements may be identified via pairwise verification whether elements comprise an identical element geometry.

In case of a pair of element references, it may be verified whether they point to the same element definition, in which case they (obviously) comprise identical element geometries. In case of a pair of elements and/or element references associated with separate element geometry specifications, explicit verification, based on geometric properties of the element geometries, may be required.

In a first embodiment, the verification may be performed via a full mapping of the geometry of a first element of the pair onto the geometry of another second element of the pair, i.e. the construction of a translation and/or a rotation which map(s) the geometry of the first element exactly onto the geometry of the second element.

Preferably, verifying whether elements of a pair of elements comprise an identical element geometry is performed without full mapping of the geometry of an element of the pair onto the geometry of another element of the pair.

Preferably, an element comprises subelements, wherein a subelement is a vertex, an edge or a face. Preferably, an element comprises a boundary representation comprising one or more boundary elements, in which case a subelement is a boundary element.

Preferably, verification whether element geometries are identical may be performed based on features of the subelements, such as number of subelements of a particular type, relative distances between certain subelements, and the like.

A "boundary representation" (BREP or B-rep) represents an element using the boundary. A BREP comprises one or more boundary elements. A boundary element is a vertex, an edge or a face. A solid, for example, may be represented as a collection of connected surface subelements, which is the boundary between solid and non-solid. A BREP, as used herein, is not limited to straight edges and planar faces. A face of a BREP may, for example, be based on a quadric surface or a non-uniform rational basis spline (NURBS). The Standard for the Exchange of Product Model data defines some exemplary data models for BREP, see e.g. ISO 10303-42, ISO 10303-508, ISO 10303-509, ISO 10303-511, ISO 10303-512, ISO 10303-513, ISO 10303-514 and ISO 10303-521.

In a second preferred embodiment, automatically verifying whether the elements of a pair of elements comprise an identical element geometry is performed via sequentially verifying identity conditions of a sequence of multiple identity conditions until either an identity condition of the sequence fails or all identity conditions of the sequence are verified. In this embodiment, an element comprises subelements, wherein a subelement is a vertex, an edge or a face. Each identity condition is based on the subelements of the elements of the pair.

One of ordinary skill in the art will appreciate that identical element geometries may be equal in size or may be proportional. In the latter case, a global scaling factor relates the dimensions of the elements. An element reference may comprise a global scaling factor. One of ordinary skill in the art will appreciate that said proportionality based on a global scaling factor has different implications for different properties. Presence properties (e.g. number of vertices) and relative size properties (e.g. ratio of a first length and a second length) should be equal. Linear size properties (e.g. length), quadratic size properties (e.g. area), and cubic size properties (e.g. volume) should be proportional to, respectively, the scaling factor, the square of the scaling factor, and the cube of the scaling factor.

Preferably, the sequence of multiple identity conditions comprises at least three, preferably at least four, more preferably at least five, even more preferably at least six, and most preferably at least seven identity conditions.

Preferably, an identity condition is based on equality of number of vertices.

Preferably, an identity condition is based on equality of number of edges.

Preferably, an identity condition is based on equality of number of faces.

Preferably, an identity condition for a pair of elements comprising an equal number of vertices is based on equality or proportionality of vertex distance lists. A vertex distance list of an element comprises an ordered set of values. Each value of the vertex distance list is based on a distance of a vertex of the element to a vertex centroid of the element. Preferably, each value of the vertex distance list is the square of the distance of a vertex of the element to a vertex centroid of the element. Preferably, the ordered set of values is ordered based on increasing or decreasing magnitude of the values.

In an example, each element of the pair of elements comprises N vertices: $P_i$ with $1 \leq i \leq N$. The CAD model comprises a GCS. Each vertex $P_i$ comprises coordinates $(x_i, y_i, z_i)$ with respect to the GCS. A vertex centroid $P_{vc}$ of the element comprises coordinates $(x_{vc}, y_{vc}, z_{vc}) = 1/N(\Sigma_{i=1}^{N} x_i, \Sigma_{i=1}^{N} y_i, \Sigma_{i=1}^{N} z_i)$. For each vertex $P_i$, the vertex distance list comprises a value equal to $d_i^2 = (x_i - x_{vc})^2 + (y_i - y_{vc})^2 + (z_i - z_{vc})^2$. The values of the vertex distance list are ordered in increasing or decreasing magnitude of the values. In case of equality or proportionality of the vertex distance lists, the corresponding identity condition is passed. Else, the identity condition is failed and further identity conditions in the sequence are not checked.

Preferably, an identity condition for a pair of elements comprising an equal number of vertices and equal or proportional vertex distance lists is based on equality of a total right-handedness (TRH). The TRH is a triple sum of the sign of the scalar triple product of a first, second and third vertex vector. A vertex vector of an element is either a vector from the vertex centroid of the element to a vertex of the element or a vector from a vertex of the element to the vertex centroid of the element. The triple sum runs over all first vertex vectors comprising a common first norm, all second vertex vectors comprising a common second norm and all third vertex vectors comprising a common third norm. The first, the second, and the third norm are different. The first, second and third norms for the elements of the pair are pairwise related via said equality or proportionality of the vertex distance lists.

In an example, the TRH is a triple sum of the sign of the scalar triple product of a first vertex vector $\vec{v}_{1,j}$, a second vertex vector $\vec{v}_{2,k}$ and a third vertex vector $\vec{v}_{3,l}$:

$$TRH = \Sigma_{j=1}^{n1} \Sigma_{k=1}^{n2} \Sigma_{l=1}^{n3} \text{sign}[(\vec{v}_{1,j} \times \vec{v}_{2,k}) \cdot \vec{v}_{3,l}].$$

A vertex vector $\vec{v}_l$ of an element is either a vector from the vertex centroid $P_{vc}$ of the element to a vertex $P_i$ of the vertex $(\vec{v}_l = (x_i - x_{vc}, y_i - y_{vc}, z_i - z_{vc}))$ or a vector from a vertex $P_i$ of the element to the vertex centroid $P_{vc}$ of the element $(\vec{v}_l = (x_{vc} - x_i, y_{vc} - y_i, z_{vc} - z_i))$, preferably the former. The first sum runs over all $n_1$ first vertex vectors comprising a common first norm $\|\vec{v}_{1,j}\|$. The second sum runs over all $n_2$ second vertex vectors comprising a common second norm $\|\vec{v}_{2,k}\|$. The third sum runs over all $n_3$ third vertex vectors comprising a common third norm $\|\vec{v}_{3,l}\|$. Hereby, sign(x) is preferably equal to 1 if $x>0$; 0 if $x=0$; and $-1$ if $x<0$.

In an example, each element comprises M different squared distances in the vertex distance list with $N \geq M \geq 3$. As the vertex distance lists of the elements of the pair of elements are equal or proportional, M is equal for both elements. The identity condition may be based on equality of ordered total right-handedness lists. For each element, an ordered vertex vector list may be obtained:

$$[(\vec{v}_{1,1}, \ldots, \vec{v}_{1,n_1}), \ldots, (\vec{v}_{M,1}, \ldots, \vec{v}_{M,n_M})] \text{ with }$$
$$\Sigma_{p=1}^{M} n_p = N.$$

The vertex vectors of the ordered vertex vector list are ordered in increasing or decreasing magnitude of the norms of the vertex vectors, preferably thereby comprising a one-one correspondence with the vertex distance list comprising said ordered set of values. Hereby, all $n_p$ p-th vertex vectors $\vec{v}_{p,t}$ comprise a common p-th norm $\|\vec{v}_{p,t}\|$, with $1 \leq p \leq N$. An ordered total right-handedness list $[TRH(1,2,3), \ldots, TRH(M-2, M-1, M)]$ of M-2 total right-handedness values $TRH(p, p+1, p+2)$ may be obtained, whereby:

$$TRH(p, p+1, p+2) = \sum_{j=1}^{n_p} \sum_{k=1}^{n_{p+1}} \sum_{l=1}^{n_{p+2}} \text{sign}[(\vec{v}_{p,j} \times \vec{v}_{p+1,k}) \cdot \vec{v}_{p+2,l}].$$

Preferably, an identity condition is based on equality or proportionality of edge parameters.

Preferably, an identity condition is based on equality or proportionality of face parameters.

In an embodiment, said sequence of identity conditions comprises at least seven identity conditions and said sequence of identity conditions comprises the following relative order for the following identity conditions:

the identity condition based on equality of number of vertices;
the identity condition based on equality of number of edges;
the identity condition based on equality of number of faces;
the identity condition based on equality or proportionality of vertex distance lists;
the identity condition based on equality of the triple sum of the sign of the scalar triple product of a first, second and third vertex vector;
the identity condition based on equality or proportionality of edge parameters; and
the identity condition based on equality or proportionality of face parameters.

In a third preferred embodiment, for an element an attributed adjacency graph (AAG) is constructed. In this embodiment, the element comprises subelements, wherein a subelement is a vertex, an edge or a face. Most preferably, at least one subelement of the element is a face. The AAG comprises graph nodes and graph edges. A graph node of the AAG represents a face of the element and is associated with one or more attributes of the face. A graph edge of the AAG interconnects two graph nodes of the AAG in case the corresponding faces of the element are adjacent and share an edge of the element. A graph edge of the AAG is associated with one or more attributes of the shared edge. Preferably, an attribute is a type specification or a geometric property. Verifying whether the elements of a pair of elements comprise an identical element geometry may in this embodiment comprise comparing the AAGs of the elements of the pair.

An identity condition of the second preferred embodiment may be based on correspondence of the AAGs of the elements of the pair.

An AAG is most preferably represented as a matrix or array. A graph node of the AAG preferably comprises a pointer to the corresponding face information, e.g. a pointer to the B-rep or a corresponding boundary element of the B-rep. A graph edge of the AAG preferably comprises a pointer to the corresponding edge information, e.g. a pointer to the B-rep or a corresponding boundary element of the B-rep.

Said second preferred embodiment may also be used for compressing a CAD model by itself, i.e. regardless of whether or not a regular grid is determined and a group of multiple equal elements is replaced with grid data. The present invention may therefore in a fourth aspect provide a CIM for compressing a CAD model, comprising the steps of:
- automatically identifying in the computer-aided design model a plurality of equal elements comprising an identical element geometry, wherein an element is an entity or a feature, wherein an element comprises subelements, wherein a subelement is a vertex, an edge or a face, comprising the step of verifying whether the elements of a pair of elements comprise an identical element geometry via sequentially verifying identity conditions of a sequence of multiple identity conditions until either an identity condition of the sequence fails or all identity conditions of the sequence are verified, wherein each identity condition is based on the subelements of the elements of the pair;
- automatically creating an element definition comprising said identical element geometry;
- automatically obtaining for each equal element of the plurality an insertion position and/or an insertion orientation;
- automatically replacing each equal element of the plurality with an element reference comprising a pointer to the element definition, and the insertion position and/or the insertion orientation of the equal element.

In a fifth aspect, the present invention may provide for a computer system for compressing a CAD model, whereby the computer system is configured for performing the CIM according to the fourth aspect. In a sixth aspect, the present invention may provide a CPP for compressing a CAD model, wherein the CPP comprises instructions which, when the CPP is executed by a computer, such as a computer system according to the fifth aspect, cause the computer to carry out the CIM according to the fourth aspect. The present invention may further also provide a tangible non-transitory computer-readable data carrier comprising the CPP according to the sixth aspect. The fourth aspect may pertain to the first aspect. The fifth aspect may pertain to the second aspect. The sixth aspect may pertain to the third aspect. All features and embodiments disclosed in this document, above or below, may relate to each of these fourth, fifth and sixth aspects, even if they have been disclosed in conjunction with a particular aspect.

Said third preferred embodiment may also be used for compressing a CAD model by itself, i.e. regardless of whether or not a regular grid is determined and a group of multiple equal elements is replaced with grid data. The present invention may therefore in a seventh aspect provide a CIM for compressing a CAD model, comprising the steps of:
- automatically identifying in the computer-aided design model a plurality of equal elements comprising an identical element geometry, wherein an element is an entity or a feature, wherein an element comprises subelements, wherein a subelement is a vertex, an edge or a face, comprising the step of verifying whether the elements of a pair of elements comprise an identical element geometry via:
  - constructing for each element of the pair an attributed adjacency graph comprising graph nodes and graph edges, wherein a graph node represents a face of the element and is associated with one or more attributes of the face, wherein a graph edge interconnects two graph nodes in case the corresponding faces of the element are adjacent and share an edge of the element, wherein the graph edge is associated with one or more attributes of the shared edge, preferably wherein an attribute is a type specification or a geometric property; and
  - comparing the attributed adjacency graphs of the elements of the pair;
- automatically creating an element definition comprising said identical element geometry;
- automatically obtaining for each equal element of the plurality an insertion position and/or an insertion orientation;
- automatically replacing each equal element of the plurality with an element reference comprising a pointer to the element definition, and the insertion position and/or the insertion orientation of the equal element.

In an eighth aspect, the present invention may provide for a computer system for compressing a CAD model, whereby the computer system is configured for performing the CIM according to the seventh aspect. In a ninth aspect, the present invention may provide a CPP for compressing a CAD model, wherein the CPP comprises instructions which, when the CPP is executed by a computer, such as a computer system according to the eighth aspect, cause the computer to carry out the CIM according to the seventh aspect. The present invention may further also provide a tangible non-transitory computer-readable data carrier comprising the CPP according to the ninth aspect. The seventh aspect may pertain to the first aspect. The eighth aspect may pertain to the second aspect. The ninth aspect may pertain to the third aspect. All features and embodiments disclosed in this document, above or below, may relate to each of these seventh, eighth and ninth aspects, even if they have been disclosed in conjunction with a particular aspect.

Preferably, the second preferred embodiment is utilized in case an element is an entity. Preferably, an element in the second preferred embodiment and the fourth aspect is an entity.

Preferably, the third preferred embodiment is utilized in case an element is a feature. Preferably, an element in the third preferred embodiment and the seventh aspect is a feature.

6. Further Embodiments

Preferably, the CAD model comprising the grid data is stored on a tangible non-transitory computer-readable storage medium.

Preferably, the CAD model comprises the element definition. Preferably, the CAD model comprising the element definition is stored on a tangible non-transitory computer-readable storage medium.

Alternatively, an element definition may be comprised in a separate CAD model or a separate file. A separate CAD model or a separate file comprising the element definition may be stored on a tangible non-transitory computer-readable storage medium. In this case, an element reference may comprise a pointer to the separate CAD model or the separate file. In this case, the element data of the grid data may comprise a pointer to the separate CAD model or the separate file.

In a preferred embodiment, in the CAD model a set of equal elements is automatically identified. The equal elements comprise an identical element geometry. The set is automatically divided into two or more disjoint sets. Preferably, said division is based on any one or multiple of:
- a distance criterion;
- two or more entities or entity groups each comprising one or more equal elements of the set, wherein each disjoint set comprises the equal elements of one of said two or more entities or entity groups; and
- a clustering algorithm.

Preferably, said division is based on a hierarchical spatial index, most preferably an R-tree, of the CAD model. In this case, said multitude is a disjoint set. For each disjoint set, a regular grid is automatically determined and a group of multiple equal elements of the disjoint set is automatically replaced in the CAD model with grid data.

In an example, multiple beams each comprise a one-dimensional linear arrangement of through-holes comprising an identical feature geometry. The set of all through-holes may be automatically identified, and subdivided into multiple disjoint sets of through-holes, based on separate beams (entities) comprising separate disjoint sets of through-holes and/or relative distances between pairs of through-holes of separate beams being significantly larger than relative distances between pairs of through-holes of a beam. Grid data may then be generated per disjoint set, i.e. for each beam.

In a preferred embodiment, multiple regular grids of multiple repetition positions are automatically determined based on insertion positions of equal elements of the multitude. One or more non-overlapping regular grids of the multiple grids are automatically selected. For each selected regular grid, a group of multiple equal elements of the multitude is automatically replaced in the CAD model with grid data. Preferably, a larger grid covering smaller grids is chosen instead of the smaller grids. Preferably, the regular grids are selected to maximize the covering of insertion points of the multitude.

In a preferred embodiment, multiple regular lattices are automatically determined based on insertion positions of equal elements of the multitude. Preferably, distance values associated with pairs of equal elements of the multitude are automatically determined. Preferably, determined distance values are automatically selected based on prevalence over the determined distance values, e.g. the five most common distance values. Preferably, the multiple regular lattices are then automatically determined based on the selected distance values, as disclosed above.

A regular lattice comprises a lattice insertion position; and one, two or three linearly independent spanning vectors. The lattice insertion position and linearly independent spanning vectors define an infinite amount of lattice points. A lattice differs from an array, pattern or grid in that a lattice is unbounded and an array, pattern or grid is bounded. An array, pattern or grid is bounded due to the number of repetitions according to each spanning vector.

For each regular lattice of the multiple regular lattices, a largest potential covering is identified. A potential covering of a regular lattice comprises (or points to) equal elements with an insertion position associated with a lattice point of the regular lattice. The insertion positions of the equal elements of a potential covering are arranged according to a grid, wherein the grid is based on the same spanning vectors as the regular lattice. "Largest", as used herein, refers to the amount of equal elements of the potential covering.

The regular lattice with most equal elements in its largest potential covering is selected. A group of multiple equal elements corresponding to the largest potential covering of the selected regular lattice is replaced with corresponding grid data. This may be performed once, or may be repeated. In case of repeated performance, an already selected regular lattice may or may not be selected again, preferably may be selected again. In case of repeated performance, one or ordinary skill in the art will appreciate that equal elements associated with a replaced group cannot be part of a subsequent largest potential covering.

In a preferred embodiment, in the CAD model a multitude of equal grids is automatically identified. The equal grids comprise an identical grid geometry. The grid geometry comprises element repetition information, optionally an element insertion orientation, and optionally a pointer to an element definition. A grid definition comprising the identical grid geometry is automatically created. In the CAD model, each equal grid of the multitude is automatically replaced with a grid reference. The grid reference comprises a grid insertion position, a pointer to the grid definition, optionally a grid insertion orientation, optionally an element insertion orientation.

The grid data may be edited based on user input. The grid insertion position may be edited based on user input. The element repetition data may be edited based on user input. A linearly independent vector of the element repetition data may be edited based on user input. The number of repetitions according to a user may be edited based on user input. A user may, for example, drag-and-drop the grid insertion position via a GUI. A user may, for example, drag-and-drop an endpoint of a linearly independent vector via a GUI. A user may, for example, enter via a keyboard numerical values specifying a linearly independent vector, a length of a linearly independent vector, and/or a number of repetitions according to a vector.

The invention is further described by the following non-limiting examples which further illustrate the invention, and are not intended to, nor should they be interpreted to, limit the scope of the invention.

EXAMPLES

Example 1: Embodiment of a CAD Model

FIG. 1 shows a schematic representation of an embodiment of a CAD model (100) comprising multiple equal entities (101, 102, 103, 104, 105, 106, 107, 108, 109, 110, 111, 112) comprising insertion positions (121, 122, 123, 124, 125, 126, 127, 128, 129, 130, 131, 132) according to a regular two-dimensional parallelogrammatic grid. The entities comprise an identical orientation (141, 142, 143, 144, 145, 146, 147, 148, 149, 150, 151, 152) with respect to a global coordinate system (X, Y) (GCS).

A plurality of equal entities is identified in the CAD model. The equal entities comprise an identical geometry. A block definition comprising the identical geometry is created. Each equal entity of the plurality is replaced in the CAD model with a block reference. The block reference comprises:
- a pointer to the block definition,
- the insertion position of the entity, and
- an insertion orientation, specifying a relative orientation of the entity with respect to a rotational configuration of the geometry of the block definition.

A multitude of equal block references is obtained from the CAD model, wherein the equal block references of the multitude comprise an identical insertion rotation. The equal block references comprise an identical entity geometry, as they all point to the same block definition.

All distance values associated with pairs of equal block references of the multitude are determined. A distance value of a pair corresponds with a distance or a power of a distance between insertion positions of the equal block references of the pair. One or more determined distance values are selected based on prevalence over the determined distance values. A regular grid of multiple repetition positions is determined based on the one or more selected distance values.

The following distance values $d_{ij}^2$ and their prevalence $N_{ij}$ may be obtained, wherein a distance value corresponds to a distance squared, with $0 \leq i < N_i = 3$, $0 \leq j < N_j = 2$, and not both $i=0$ and $j=0$ at the same time:

For $i \neq 0$ and $j \neq 0$:

$$d_{ij}^2 = i^2 A^2 + 2ijAB \sin^2(S) + j^2 B^2 \text{ with } N_{ij}^+ = (N_i - 1)(N_j - 1)$$

$$d_{ij}^2 = i^2 A^2 - 2ijAB \sin^2(S) + j^2 B^2 \text{ with } N_{ij}^- = (N_i - 1)(N_j - 1)$$

For $i=0$ or $j=0$, but not both $i=0$ and $j=0$ at the same time:

$$d_{ij}^2 = i^2 A^2 + j^2 B^2 \text{ with } N_{ij} = (N_i - 1)(N_j - 1)$$

Most prevalent are $A^2$ (9 times) and $B^2$ (8 times) if $S \neq 0$ and $A \neq B$. The selected distance values comprise at least $A^2$ and $B^2$.

For each selected distance value, one or more linearly independent translation vectors (multiple linearly independent translation vectors if $A=B$) between insertion points of equal elements are automatically determined. Multiple regular lattices are automatically determined based on the insertion points and the determined translation vectors. A regular lattice of the multiple regular lattices, may for example, comprise lattice insertion position (128) and two translation vectors parallel to and equal in length to resp. vectors (160) and (161). For each regular lattice, a largest potential covering is identified. The regular lattice with most equal elements in its largest potential covering is selected. Grid data associated with the largest potential covering of the selected regular lattice is determined. A grid insertion position (123); a first spanning vector (160) parallel with a X-axis (X) of the GCS; a second spanning vector (161) parallel to a XY-plane of the GCS and comprising an angle (S) with respect to a Y-axis (Y) of the GCS; a first number of repetitions according to the first spanning vector (four); and a second number of repetitions according to the second spanning vector (three) are determined based on the largest potential covering of the selected regular lattice, in particular the insertion positions and the translation vectors.

In the CAD model, the equal block references comprising an insertion position coinciding with a repetition position of the regular grid (i.e. largest potential covering of the selected regular lattice) are replaced with grid data. The grid data comprises the grid insertion position (123), the first spanning vector (160), the second spanning vector (161), the first number of repetitions (four), the second number of repetitions (three), a pointer to the block definition, and the identical insertion rotation of the equal element references of the multitude.

Compression of the CAD model is achieved.

The invention claimed is:

1. A computer-implemented method for compressing a computer-aided design model, comprising the steps of:
    automatically identifying in the computer-aided design model a plurality of equal elements comprising an identical element geometry via pairwise verification whether elements comprise identical geometry, wherein an element is an entity or a feature;
    automatically creating an element definition comprising said identical element geometry;
    automatically obtaining for each equal element of the plurality an insertion position and an insertion orientation;
    automatically replacing each equal element of the plurality with an element reference comprising a pointer to the element definition, the insertion position of the equal element, and the insertion orientation of the equal element;
    automatically obtaining a multitude of element references comprising a pointer to said same element definition and an identical insertion orientation;
    automatically determining distance values associated with pairs of element references of the multitude, wherein a distance value of a pair corresponds with a distance or a power of a distance between insertion positions of the element references of the pair;
    automatically selecting one or more determined distance values based on prevalence over the determined distance values;
    automatically determining for each selected distance value a candidate vector between insertion positions of two element references;
    automatically determining a regular grid of multiple repetition positions, each coinciding with an insertion position of an element reference of the multitude, based on one, two or three linearly independent vectors of the determined candidate vectors;
    automatically replacing in the computer-aided design model a group of multiple equal elements of the multitude, which comprise an insertion position associated with a repetition position of the regular grid, with grid data comprising a grid insertion position, said identical insertion orientation, said pointer to the element definition, and element repetition information comprising said linearly independent vectors and for each vector a number of repetitions according to the vector.

2. The computer-implemented method according to preceding claim 1, comprising the step of automatically verifying whether the elements of a pair of elements comprise an identical element geometry via sequentially verifying identity conditions of a sequence of multiple identity conditions until either an identity condition of the sequence fails or all identity conditions of the sequence are verified, wherein an element comprises subelements, wherein a subelement is a vertex, an edge or a face, wherein each identity condition is based on the subelements of the elements of the pair, wherein the step of verifying whether the elements of the pair comprise an identical element geometry is performed without full mapping of the geometry of an element of the pair onto the geometry of another element of the pair, wherein an element comprises a boundary representation comprising one or more boundary elements, wherein a subelement is a boundary element, wherein:
    an identity condition is based on equality of number of vertices;
    an identity condition is based on equality of number of edges;
    an identity condition is based on equality of number of faces;
    an identity condition for a pair of elements comprising an equal number of vertices is based on equality or proportionality of vertex distance lists, wherein a vertex distance list of an element comprises an ordered set of values, wherein each value is based on a distance of a vertex of the element to a vertex centroid of the element;

an identity condition for a pair of elements comprising an equal number of vertices and equal or proportional vertex distance lists is based on equality of a triple sum of the sign of the scalar triple product of a first, second and third vertex vector, wherein a vertex vector of an element is either a vector from the vertex centroid of the element to a vertex of the element or a vector from a vertex of the element to the vertex centroid of the element, wherein the triple sum runs over all first vertex vectors comprising a common first norm, all second vertex vectors comprising a common second norm and all third vertex vectors comprising a common third norm, wherein the three norms are different, wherein the first, second and third norms for the elements of the pair are pairwise related via said equality or proportionality of the vertex distance lists;

an identity condition is based on equality or proportionality of edge parameters;

an identity condition is based on equality or proportionality of face parameters.

3. A computer system for compressing a computer-aided design model, wherein the computer system is configured for performing the computer-implemented method according to claim 2.

4. A computer program product for compressing a computer-aided design model, wherein the computer program product comprises instructions stored on a non-transient storage medium which, when the computer program product is executed by a computer, cause the computer to carry out the steps of the computer-implemented method according to claim 2.

5. The computer-implemented method according to preceding claim 1, wherein the method comprises the step of automatically constructing for an element an attributed adjacency graph, wherein the element comprises subelements, wherein a subelement is a vertex, an edge or a face, wherein at least one subelement of the element is a face, wherein the attributed adjacency graph comprises graph nodes and graph edges, wherein a graph node represents a face of the element and is associated with one or more attributes of the face, wherein a graph edge interconnects two graph nodes in case the corresponding faces of the element are adjacent and share an edge of the element, wherein the graph edge is associated with one or more attributes of the shared edge, wherein the method further comprises the step of verifying whether the elements of a pair of elements comprise an identical element geometry via comparing the attributed adjacency graphs of the elements of the pair, wherein an attribute is a type specification or a geometric property, wherein the step of verifying whether the elements of the pair comprise an identical element geometry is performed without full mapping of the geometry of an element of the pair onto the geometry of another element of the pair, wherein an element comprises a boundary representation comprising one or more boundary elements, wherein a subelement is a boundary element.

6. A computer system for compressing a computer-aided design model, wherein the computer system is configured for performing the computer-implemented method according to claim 5.

7. A computer program product for compressing a computer-aided design model, wherein the computer program product comprises instructions stored on a non-transient storage medium which, when the computer program product is executed by a computer, cause the computer to carry out the steps of the computer-implemented method according to claim 5.

8. The computer-implemented method according to preceding claim 1, wherein in the computer-aided design model a set of equal elements comprising an identical element geometry is automatically identified, wherein the set is automatically divided into two or more disjoint sets, wherein said multitude is a disjoint set, wherein for each disjoint set said automatically determining of a regular grid and said automatically replacing in the computer-aided design model of a group of multiple element references of the disjoint set with grid data are performed, wherein the set is automatically divided into two or more disjoint sets based on any one or multiple of: a distance criterion; two or more entities or entity groups each comprising one or more equal elements of the set, wherein each disjoint set comprises the equal elements of one of said two or more entities or entity groups; and a clustering algorithm.

9. A computer system for compressing a computer-aided design model, wherein the computer system is configured for performing the computer-implemented method according to claim 8.

10. A computer program product for compressing a computer-aided design model, wherein the computer program product comprises instructions stored on a non-transient storage medium which, when the computer program product is executed by a computer, cause the computer to carry out the steps of the computer-implemented method according to claim 8.

11. The computer-implemented method according to preceding claim 1, wherein multiple regular grids of multiple repetition positions based on insertion positions of element references of the multitude are automatically determined, wherein the method comprises the step of automatically selecting one or more non-overlapping regular grids of the multiple regular grids, wherein for each selected regular grid said automatically replacing in the computer-aided design model of a group of multiple element references of the multitude with grid data is performed, preferably wherein a larger grid covering smaller grids is chosen instead of the smaller grids, wherein the regular grids are selected to maximize the covering of insertion positions.

12. A computer system for compressing a computer-aided design model, wherein the computer system is configured for performing the computer-implemented method according to claim 11.

13. A computer program product for compressing a computer-aided design model, wherein the computer program product comprises instructions stored on a non-transient storage medium which, when the computer program product is executed by a computer, cause the computer to carry out the steps of the computer-implemented method according to claim 11.

14. A computer system for compressing a computer-aided design model, wherein the computer system is configured for performing the computer-implemented method according to claim 1.

15. A computer program product for compressing a computer-aided design model, wherein the computer program product comprises instructions stored on a non-transient storage medium which, when the computer program product is executed by a computer, cause the computer to carry out the steps of the computer-implemented method according to claim 1.

* * * * *